(12) United States Patent
Tiwari

(10) Patent No.: US 7,057,234 B2
(45) Date of Patent: Jun. 6, 2006

(54) SCALABLE NANO-TRANSISTOR AND MEMORY USING BACK-SIDE TRAPPING

(75) Inventor: Sandip Tiwari, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 10/462,386

(22) Filed: Jun. 16, 2003

(65) Prior Publication Data

US 2004/0108537 A1 Jun. 10, 2004

Related U.S. Application Data

(60) Provisional application No. 60/431,602, filed on Dec. 6, 2002.

(51) Int. Cl.
*H01L 27/01* (2006.01)

(52) U.S. Cl. .................. 257/324; 257/347; 257/348; 257/349; 257/350

(58) Field of Classification Search ........ 257/347–354, 257/324
See application file for complete search history.

(56) References Cited

U.S. PATENT DOCUMENTS

| | | | |
|---|---|---|---|
| 5,932,889 A | | 8/1999 | Matsumura et al. |
| 5,937,295 A | | 8/1999 | Chen et al. |
| 6,011,725 A | | 1/2000 | Eitan |
| 6,281,551 B1 | | 8/2001 | Chan et al. |
| 6,445,032 B1 | | 9/2002 | Kumar et al. |
| 6,487,121 B1 | * | 11/2002 | Thurgate et al. ...... 365/185.18 |
| 6,639,271 B1 | * | 10/2003 | Zheng et al. ................ 257/324 |
| 2001/0055838 A1 | * | 12/2001 | Walker et al. .............. 438/129 |
| 2002/0025604 A1 | | 2/2002 | Tiwari |
| 2002/0043693 A1 | | 4/2002 | Tiwari et al. |
| 2004/0041208 A1 | * | 3/2004 | Bhattacharyya ............. 257/347 |

FOREIGN PATENT DOCUMENTS

EP  0 858 110 A1  12/1998

OTHER PUBLICATIONS

S. Tiwari, F. Rana, K. Chan, H. Hanafi, W. Chen and D. Buchanan, "Volatile and Non-Volatile Memories in Silicon with Nano-Crystal Storage", IEEE, 1995, pp. 521-524.

H. Hanafi et al., "A Scalable Low Power Vertical Memory", IEEE, 1995, pp. 657-660.

(Continued)

Primary Examiner—Donghee Kang
(74) Attorney, Agent, or Firm—Wolf, Greenfield & Sacks, P.C.

(57) ABSTRACT

According to an aspect of the invention, a device structure is provided where charging and discharging occur in a trapping region formed by a stack of films that is placed on the back of a thin silicon channel. Uncoupling the charging mechanisms that lead to the memory function from the front gate transistor operation allows efficient scaling of the front gate. But significantly more important is a unique character of these devices: these structures can be operated both as a transistor and as a memory. The thin active silicon channel and the thin front oxide provide the capability of scaling the structure to tens of nanometers, and the dual function of the device is obtained by using two voltage ranges that are clearly distinct. At small voltages the structure operates as a normal transistor, and at higher voltages the structure operates as a memory device.

64 Claims, 13 Drawing Sheets

OTHER PUBLICATIONS

A. Kumar and S. Tiwari, "Scaling of Flash NVRAM to 10's of nm by Decoupling of Storage From Read/Sense Using Back-Floating Gates", IEEE, Dec. 2002, vol. 1, No. 4, pp. 247-254.

D. Frank, "Foreword", IEEE, Dec. 2002, vol. 1, No. 4, p. 169.

I. Yang, C. Vieri, A. Chandrakasan, and D. Antoniadis, "Back gated CMOS on SOIAS For Dynamic Threshold Voltage Control", IEEE, 1995, pp. 877-880.

L. Xue, C. Liu and S. Tiwari, "Multi-Layers with Buried Structures (MLBS): An Approach to Three-Dimensional Integration" IEEE, 2001, pp. 117-118.

S. Tiwari, P. Solomon, J. Welser, E. Jones, F. McFeely and E. Cartier, "CMOS and Memories: From 100 nm to 10 nm!", Elsevier Science B.V., 1999, pp. 3-6.

Search Report dated Aug. 26, 2004 from corresponding International Application No. PCT/US03/38826.

* cited by examiner

| | $V_G(V)$ | $V_D(V)$ | $V_S(V)$ | $V_{SUB}(V)$ |
|---|---|---|---|---|
| Write | −7.5 | −5 | −10 | 0 |
| Erase | +10 | +10 | +10 | 0 |

SCALABLE NANO-TRANSISTOR AND MEMORY USING BACK-SIDE TRAPPING

CROSS REFERENCE TO RELATED APPLICATION

This application claims priority based on provisional application Ser. No. 60/431,602, filed Dec. 6, 2002, which is hereby incorporated by reference.

FIELD OF THE INVENTION

This invention relates to electronic circuits and, more particularly, to semiconductor devices that can be operated both as a transistor and as a memory device. The invention also relates to methods of fabricating such devices, to semiconductor wafers in which such devices may be fabricated, to methods for fabricating such wafers, and to their use in integrated circuit applications.

BACKGROUND OF THE INVENTION

Many system-on-chip (SOC) applications and most microelectronic applications require the use of logic circuitry and memory circuitry simultaneously on the same integrated circuit chip. All stand-alone memory chips have both memory and logic together on them. The logic and memory devices and structures are usually quite dissimilar. One common example of memory use is for non-volatile or long retention time storage of data. Many applications, such as mobile communications and others requiring local storage of microcode, require the existence of non-volatile memory and logic circuitry simultaneously. Such applications, which load programs on boot-up, are becoming ubiquitous. Such circuits, most of which are examples of systems-on-chip, require complex processing because of the different ways that logic and memory circuitry are implemented. In addition, as device dimensions have decreased, silicon-on-insulator (SOI) technology has become more popular and is expected to be a mainstream technology at gate lengths below 70 nanometers (nm). Conventional front-floating gate memory structures do not scale effectively due to gate-stack thickness limitations and due to inefficient coupling of hot carriers to front floating gates.

Carrier trapping through defects and interface states in oxide-nitride-oxide (ONO) stacked films has been successfully utilized in non-volatile memory devices for the past four decades. Injection of charge in these devices can be achieved by Fowler-Nordheim (FN) tunneling or hot electron injection. Removal of charge is usually by Fowler-Nordheim tunneling. In recent years, as transistor dimensions have been scaled and technology has become more complex, there has been increased interest in these devices because of attributes expected from a large interface-state density with highly localized trapping that may be distinctly different from those of nanocrystals. Advantages include thinner gate-stacks, long retention times, reasonably low power and high endurance. However, due to the structure of the conventional ONO-based memory device, the presence of a trapping layer between the channel of the device and the gate imposes restrictions on scaling of these devices because of the interdependence of electrostatics, voltages needed for adequate programming, speed, capture cross-sections, erasing speed and non-volatility.

Accordingly, there is a need for new devices and methods of fabrication that overcome one or more of the above drawbacks.

SUMMARY OF THE INVENTION

According to an aspect of the invention, a new device structure is provided where charging and discharging occur in a trapping region formed by a stack of films that is placed on the back of a thin silicon channel. Uncoupling the charging mechanisms that lead to the memory function from the front gate transistor operation allows efficient scaling of the front gate. But significantly more important is a unique character of these devices: these structures can be operated both as a transistor and as a memory. The thin active silicon channel and the thin front oxide provide the capability of scaling the structure to tens of nanometers, and the dual function of the device is obtained by using two voltage ranges that are clearly distinct. At small voltages the structure operates as a normal transistor, and at higher voltages the structure operates as a memory device.

According to an aspect of the invention, a semiconductor device is provided. The semiconductor device comprises a substrate, a charge trapping region disposed on the substrate, a semiconductor layer over the charge trapping region, and at least one transistor formed in the semiconductor layer.

The semiconductor device may operate as a transistor in response to a first set of voltages and may operate as a memory device in response to a second set of voltages. The second set of voltages may be larger than the first set of voltages.

The charge trapping region may comprise a stack of insulating films. In some embodiments, the charge trapping region comprises an injecting layer on a back surface of the semiconductor layer, a charge trapping layer on a back surface of the injecting layer and a control layer on a back surface of the charge trapping layer. The injecting layer may comprise silicon dioxide, the charge trapping layer may comprise silicon nitride and the control layer may comprise silicon dioxide.

The charge trapping region may comprise a material that captures electrons through defects, bulk traps, or interface traps, such as an insulating oxide that is compatible with silicon processing. In some embodiments, the charge trapping region comprises a material selected from the group consisting of silicon nitride, aluminum oxide, hafnium oxide, zirconium oxide, hafnium silicate, zirconium silicate, and combinations thereof.

In some embodiments, the charge trapping region comprises nanocrystals of an inorganic compound, such as a material selected from the group consisting of silicon, germanium, carbon and their compounds, or even metals that are compatible with silicon processing. The charge trapping region may comprise nanocrystals of a semiconductor material in an oxide, a nitride or another insulating matrix. In some embodiments, the charge trapping region comprises nanocrystals in combination with an insulator that is compatible with silicon processing.

The substrate may comprise silicon. In some embodiments, the substrate comprises a Group III–IV material or germanium or silicon carbide. In further embodiments, the substrate comprises a polymer.

According to another aspect of the invention, an integrated circuit is provided. The integrated circuit comprises a substrate, a semiconductor layer having a plurality of transistors formed therein, and a charge trapping region on a back surface of the semiconductor layer between the semiconductor layer and the substrate.

According to a further aspect of the invention a method is provided for fabricating a semiconductor device. The method comprises providing a substrate, providing a charge trapping region on the substrate, providing a semiconductor layer on the charge trapping region, and forming at least one transistor in the semiconductor layer.

According to a further aspect of the invention, a semiconductor wafer is provided. The semiconductor wafer comprises a substrate, a charge trapping region disposed on the substrate, and a semiconductor layer disposed on the charge trapping region.

According to a further aspect of the invention, a method is provided for fabricating a semiconductor wafer. The method comprises providing a substrate, providing a charge trapping region on the substrate, and providing a semiconductor layer on the charge trapping region.

According to a further aspect of the invention, a method of fabricating a semiconductor wafer is provided. The method comprises providing a first substrate; forming an oxide layer on the first substrate; providing a second substrate; forming a charge trapping region on the second substrate; defining a semiconductor layer and a sacrificial portion of the second substrate; bonding the first substrate to the second substrate by bonding the charge trapping region to the oxide layer to form a wafer assembly; and removing the sacrificial portion of the second substrate from the wafer assembly to form a semiconductor wafer having the semiconductor layer, the charge trapping region and the first substrate.

According to a further aspect of the invention, a method of fabricating a semiconductor wafer is provided. The method comprises providing a first substrate; forming a first oxide layer on the first substrate; providing a second substrate comprising a silicon-on-insulator wafer having a second oxide layer on a silicon substrate and a silicon layer on the second oxide layer; forming a charge trapping region on the silicon-on-insulator wafer; bonding the first substrate to the second substrate by bonding the charge trapping region to the first oxide layer to form a wafer assembly; and removing the silicon substrate and the second oxide layer from the wafer assembly to form a semiconductor wafer having the silicon layer, the charge trapping region and the first substrate.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
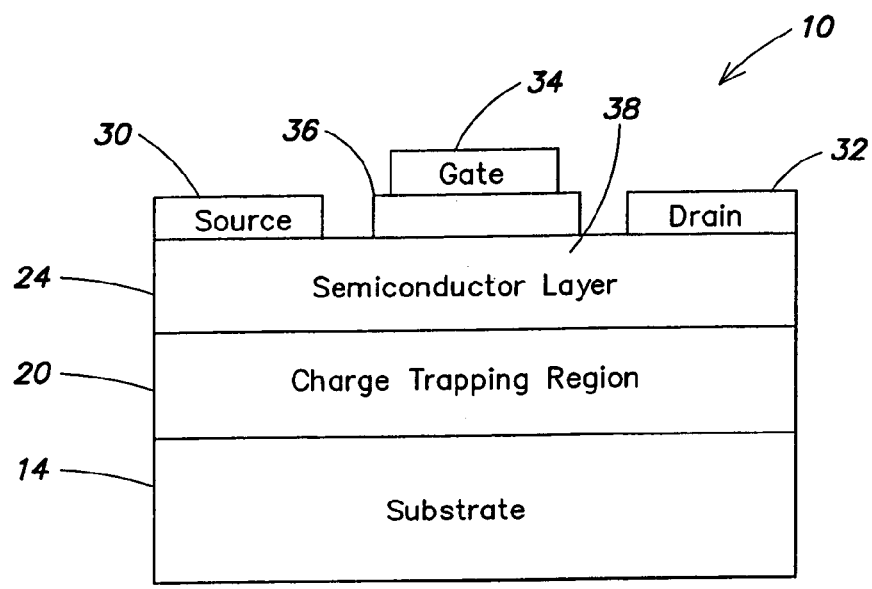
FIG. 1 is a schematic cross-sectional diagram of a semiconductor device in accordance with an embodiment of the invention.

A schematic cross-sectional view of a semiconductor device 10 in accordance with an embodiment of the invention is shown in FIG. 1. A substrate 14 may be silicon or silicon having an oxide layer on an upper surface thereof, for example. However, substrate 14 is not limited to silicon. A charge trapping region 20 is formed on an upper surface of substrate 14. By way of example, charge trapping region 20 may be an insulating layer or a stack of insulating layers selected to perform a charge trapping function or a stack of insulating layers with nanocrystals embedded in it. The structure and operation of charge trapping region 20 are described in detail below. A semiconductor layer 24 is formed on an upper surface of charge trapping region 20. A source 30, a drain 32 and a gate 34 may be formed in semiconductor layer 34 to define a transistor. As is known in the art, gate 34 is spaced from semiconductor layer 24 by a gate oxide 36, and a channel 38 is defined in semiconductor layer 24 beneath gate 34.

Multiple semiconductor devices of the type shown in FIG. 1 may be formed in semiconductor layer 24 to define an integrated circuit. The devices may be both n-type and p-type. The devices may be interconnected to define logic circuitry, memory circuitry, or a combination of logic circuitry and memory circuitry. Each individual semiconductor device may function as a transistor or as a memory device, depending on bias conditions. The dual function of the semiconductor device is described below.

Figure 2:
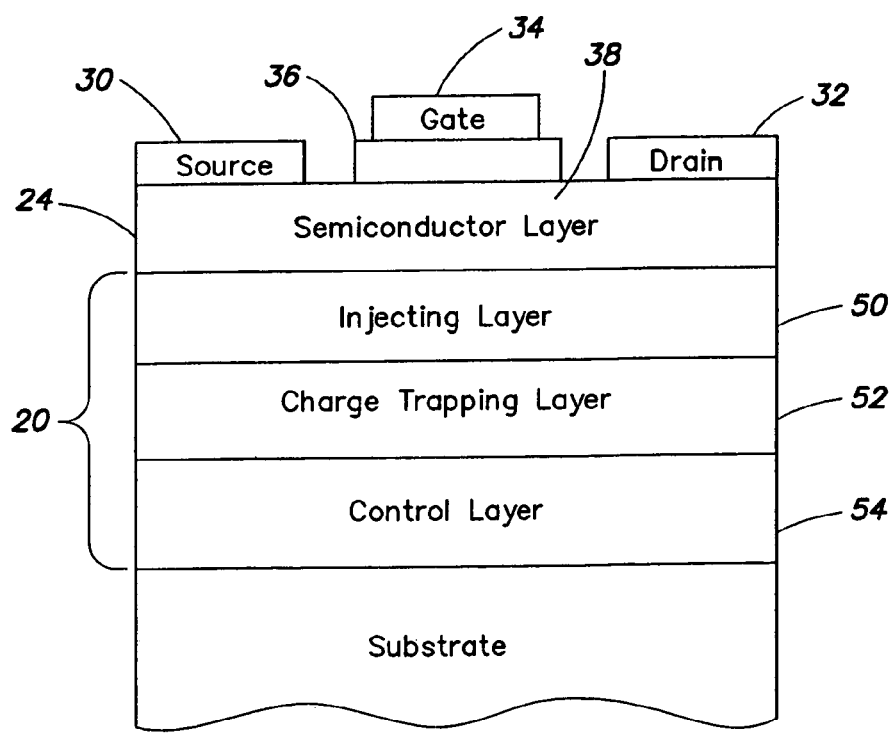
FIG. 2 is a schematic cross-sectional diagram of a semiconductor device in accordance with another embodiment of the invention.

A schematic cross-sectional view of a semiconductor device in accordance with another embodiment of the invention is shown in FIG. 2. Like elements in FIGS. 1 and 2 have the same reference numerals. In the embodiment of FIG. 2, support substrate 14 may be an n++ silicon substrate, and semiconductor layer 24 may be a thin silicon layer. Charge trapping region 20 may include a silicon dioxide injecting layer 50, a silicon nitride charge trapping layer 52 and a silicon dioxide control layer 54. In one embodiment, layers 50, 52 and 54 have thicknesses of 8, 15 and 40 nanometers, respectively. Devices may be fabricated using standard CMOS techniques with mixed lithography (optical and electron beam).

While these embodiments are based on n-type devices using electrons, other embodiments, changed in polarity, are based on p-type devices using holes.

Integrated circuits having silicon-on-insulator substrates usually provide high performance with higher speed at lower power dissipation than comparable implementations in bulk silicon. The present invention provides methods and structures which, in some embodiments, implement silicon-on-insulator based structures in such a way that transistors and nonvolatile or long retention memories can be fabricated simultaneously with similar cross-sections and with minimum increase in the number of process steps. In these embodiments, logic devices are used at low voltages (less than 2.5 volts at gate lengths below 130 nanometers), while higher voltages in a range of about 5–15 volts, with appropriate biasing of the gate, drain source and substrate, are used to operate the structures as non-volatile or long retention memories. This approach allows the simultaneous fabrication of logic and memory structures appropriate to a large variety of large scale integrated circuits.

In some embodiments, the invention provides methods and structures for achieving memory together with logic circuitry in a silicon-on-insulator structure, where the range of bias voltages, low for transistors and larger for memory, allows the same structure to function as a logic device or as a memory device. A feature of the structure is in placing the storage of carriers on the back side of a transistor channel. This allows one to obey the insulator thickness constraints required for long-term storage in a memory while letting the gate oxide of the transistor be scaled for good operation of the device. The silicon-on-insulator embodiments of the invention can be scaled to tens of nanometers. The storage of charge on the back side of the transistor channel, over a longer region, also allows the devices to have scalability in the memory form to dimensions that are similar to those of the transistor.

The storage on the back of the transistor channel is achieved through traps, either in bulk film or in interface states. A common form of providing such carrier trapping centers is through the use of an oxide-silicon nitride interface where the oxide surfaces may or may not be pretreated. Silicon nitride itself also provides trapping centers. Other materials that are compatible with silicon processing technology, e.g. aluminum oxide, may be used for such trapping interface. However, silicon nitride is preferred because of its more robust properties as a diffusion barrier. Additional embodiments of the charge trapping region are described below.

Thus, the structure includes, within a silicon-on-insulator technology, a charge trapping region under the silicon channel. If such a charge trapping region is present and is efficient-only when sufficient voltage is applied to inject charge into the interface and bulk states, then the structure can operate both as a transistor and as a memory device. In the device of FIG. 1, for example, normal operation of the transistor occurs with low voltages on the source, drain and gate, typically less than 2.5 volts for technologies below 150 nanometers in gate length.

The charge trapping region 20 performs a charge trapping function for memory operation. Different configurations of the charge trapping region may be utilized. The charge trapping region may comprise a material that captures electrons through defects or bulk traps. The charge trapping region may comprise an insulating film or a stack of insulating films. In some embodiments, the charge trapping region comprises an injecting layer, such as silicon dioxide, on a back surface of the semiconductor layer, a charge trapping layer, such as silicon nitride, on a back surface of the injecting layer and a control layer, such as silicon dioxide, on a back surface of the charge trapping layer. The charge trapping region and the device can also be based on hole trapping.

For SOI implementations, the injecting layer may have a thickness in a range of about 0.5 nm to 50 nm, the charge trapping layer may have a thickness in a range of about 0.3 nm to 50 nm, and the control layer may have a thickness in a range of about 0.5 nm to 100 nm. However, the thicknesses of the layers and the number of layers in the charge trapping region are not limited to these ranges.

The charge trapping region may comprise a silicon dioxide-silicon nitride interface and in other embodiments may comprise additional silicon nitride. In the typical case of a silicon substrate and a silicon semiconductor layer, the charge trapping region may comprise an oxide or other insulator that is compatible with silicon processing. The charge trapping region typically serves as an insulating layer between the substrate and the semiconductor layer. The charge trapping region may comprise a material selected from the group consisting of silicon nitride, aluminum oxide, hafnium oxide, zirconium oxide, hafnium silicate, zirconium silicate, and combinations thereof.

The charge trapping region may comprise nanocrystals of an inorganic compound interspersed in an insulating medium. In some embodiments, the charge trapping region comprises nanocrystals of a semiconductor material in an oxide, a nitride or another insulating matrix. The charge trapping region may comprise nanocrystals of a material selected from the group consisting of silicon, germanium and their compounds. In further embodiments, the charge trapping region comprises nanocrystals in combination with an insulator that is compatible with silicon processing. In additional embodiments, the charge trapping region comprises nanocrystals of a metal or metal oxide in an oxide, nitride, or another insulating matrix. Nanocrystals are described, for example, in S. Tiwari, F. Rana, K. Chan, M. Manafi, W. Chen and D. Buchanan, "Volatile and Non-Volatile Memories in Silicon with Nano-Crystal Storage", Tech. Dig. of IEDM, p. 657, Dec. 1995 and U.S. Pat. No. 5,937,295, Nanostructure Memory Device, issued Aug. 10, 1999 to W. Chen, T. P. Smith and S. Tiwari.

In preferred embodiments, the substrate and the semiconductor layer are silicon. In some embodiments, the substrate is a group III–IV material. In further embodiments, the substrate is a polymer. In some embodiments the semiconductor layer is a group III–V compound, or a polymer, or Ge, SiC or SiGe. The semiconductor layer 24 may be the same material as substrate 14, typically with a different doping level, and may have a thickness in a range of 1 nm to 100 nm.

Figures 3, 4:
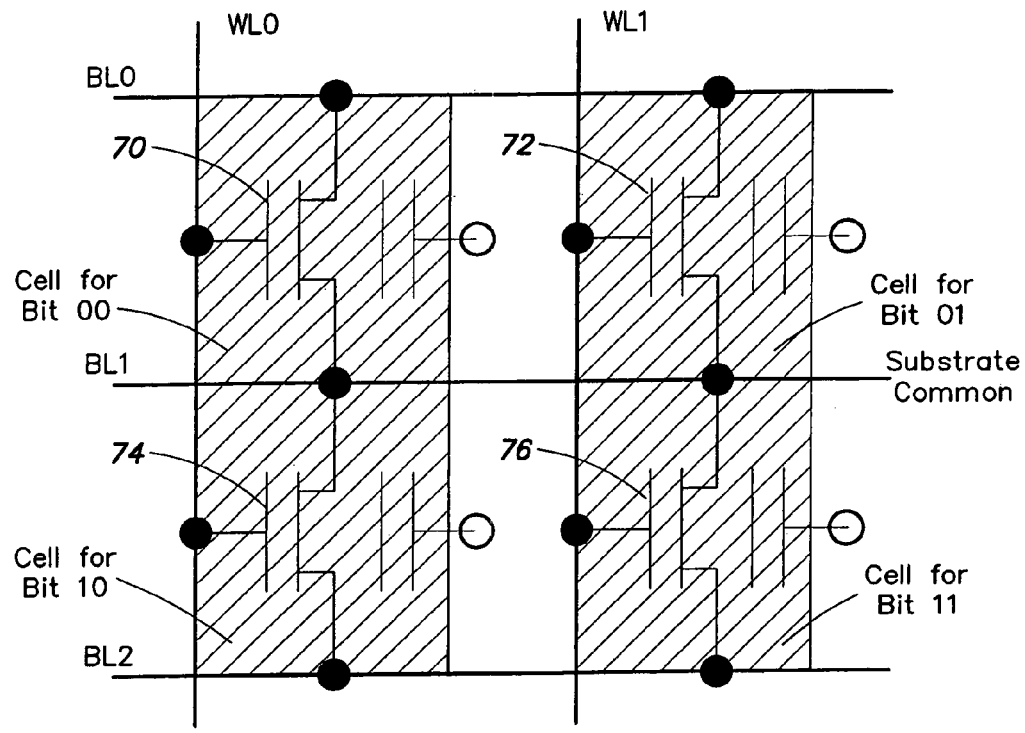
FIG. 3 is a schematic diagram of a random access memory in a NOR architecture according to an embodiment of the invention.
FIG. 4 is a table that illustrates examples of voltages for writing and erasing a memory cell in accordance with an embodiment of the invention.

A schematic diagram of a memory array incorporating semiconductor devices in accordance with an embodiment of the invention is shown in FIG. 3. Each memory cell of the array may include a semiconductor device of the type shown in FIG. 1 and described above. A cell for bit 00 includes a device 70, a cell for bit 01 includes a device 72, a cell for bit 10 includes a device 74, and a cell for bit 11 includes a device 76. The drains of devices 70 and 72 are connected to a bit line BL0. The sources of devices 70 and 72 and the drains of devices 74 and 76 are connected to a bit line BL1. The sources of devices 74 and 76 are connected to a bit line and BL2. The gates of devices 70 and 74 are connected to a word line WL0, and the gates of devices 72 and 76 are connected to a word line WL1. The substrate is connected to a reference voltage, such as ground. It will be understood that the array shown in FIG. 3 can be replicated in two dimensions to form a memory array having a desired number of memory cells.

In operation, when a negative voltage is applied to the source, a larger negative voltage applied to the drain, with the substrate grounded and the gate at the larger negative voltage, then carriers from the channel are energetically injected into the underlying charge trapping region from the electron channel formed between source and drain. This traps charge in the memory device, and the state can be stored. Random access of different memory cells can be achieved by suitable biasing. Thus, in FIG. 3 bit 00 may be written with charge by biasing bit line BL1 at −5 volts, word line WL0 at −10 volts and bit line BL0 at −10 volts. By not biasing bit line BL2 and word line WL1, only transistor 70 for bit 00 is charged. Bit 00 can be erased by applying a positive voltage, such as +10 volts, to the source, drain and gate of device 70. It will be understood that these voltages are given by way of example only and are not limiting as to the scope of the invention. Other suitable voltages that are significantly different from the voltage required for transistor operation, typically 2 volts, may be utilized. Thus, for example, the voltages applied to the source and the drain can be swapped. These voltages can be translated to other voltages by a suitable shift in the substrate bias voltage. Another example of suitable write and erase voltages is shown in FIG. 4. In the charging process, the difference in drain and source bias is provided in order to create hot electrons that can be efficiently injected into the charge trapping region.

Other biasing configurations can be used to achieve memory operation. Bit 00 may be charged by using the substrate as the common electrode biased at ground. Bit 00 is biased by hot electron injection using biasing of bit line BL1 and bit line BL0 for efficient injection. Thus, bit line BL1 may be biased at −5 volts and bit line BL0 may be biased at −10 volts, while all other bit lines are either grounded or open. In order to prevent injection in the other cells connected to the same bit lines, those transistors can be turned off by applying a negative voltage, for example −5 volts, to the word lines WL of the array. In addition, there are other techniques by which random access and prevention of write-disturb can be achieved in these structures, similar to those used in front-floating gate structures.

Figure 5:
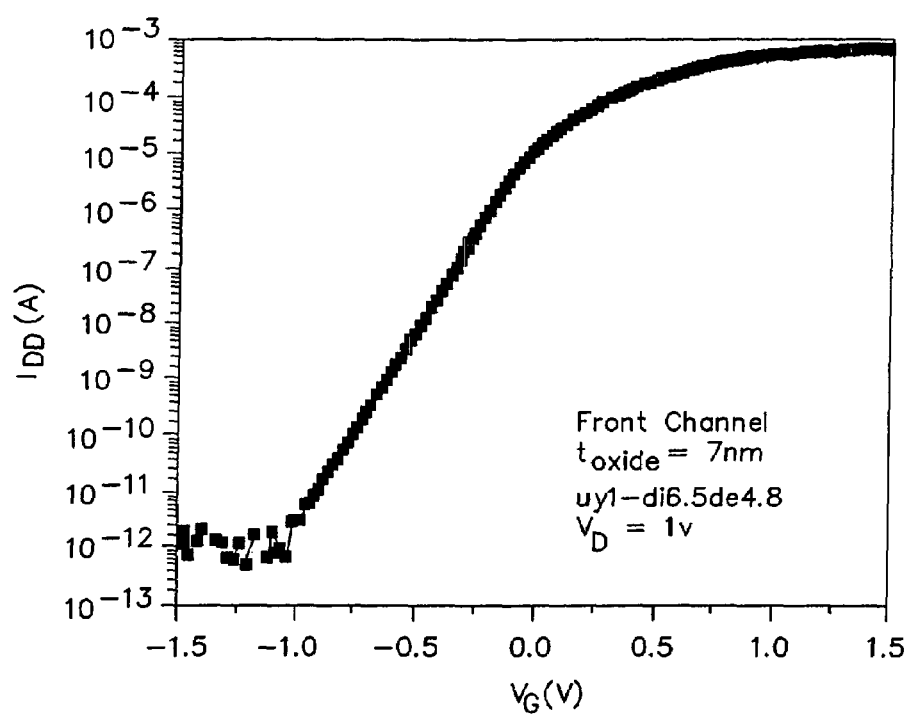
FIG. 5 is a graph of drain current as a function of gate voltage of a semiconductor device in accordance with an embodiment of the invention.
Figure 6:
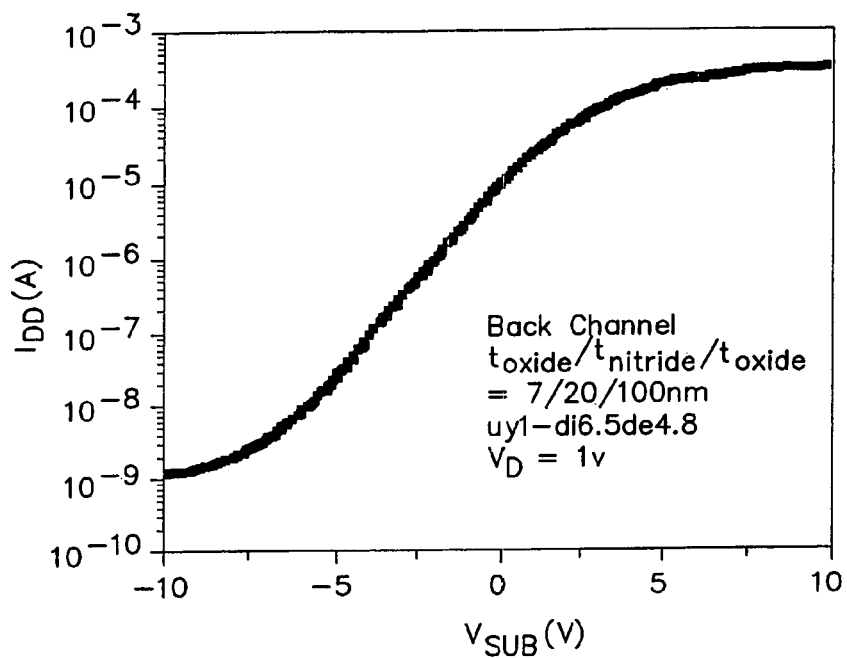
FIG. 6 is a graph of drain current as a function of substrate voltage of a semiconductor device in accordance with an embodiment of the invention.

Measured electrical characteristics of a semiconductor device of the type shown in FIG. 2 and described above are illustrated in FIGS. 5–7. In the device tested, silicon layer 24 had a thickness of approximately 60 nanometers, and gate oxide 36 had a thickness of 7 nanometers. In charge is trapping region 20, oxide layer 50 had a thickness of 7 nanometers, nitride layer 52 had a thickness of 20 nanometers and oxide layer 54 had a thickness of 100 nanometers. FIG. 5 is a graph of drain current as a function of voltage on gate 34, with drain 32 at 1 volt, and illustrates the front channel characteristics of the device. FIG. 6 is a graph of drain current as a function of voltage on substrate 14, with drain 32 at 1 volt, and illustrates the back channel characteristics of the device.

Figure 7:
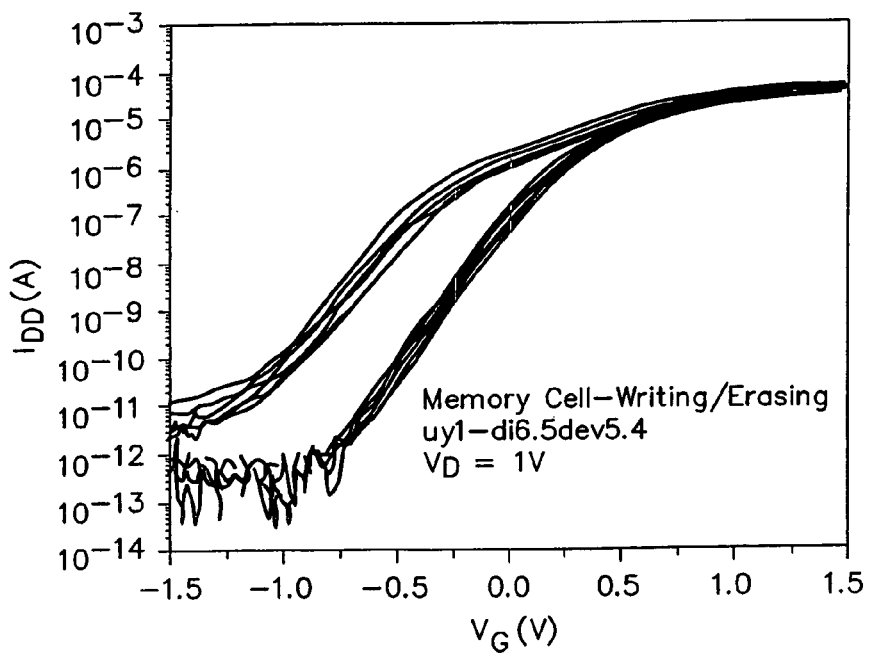
FIG. 7 is a graph of drain current as a function of gate voltage that illustrates the memory characteristics of a semiconductor device in accordance with an embodiment of the invention in the two programmed states.

FIG. 7 is a graph of drain current as a function of voltage on gate 34, with drain 32 at 1 volt, and illustrates the memory characteristics of the device. FIG. 7 shows 10 cycles of writing and erasing of the device. The writing bias conditions were gate 34 at −7.5 volts, drain 32 at −5 volts, source 30 at −10 volts and substrate 14 at ground for 100 ms (milliseconds) per write. The erasing bias conditions were gate 34 at +10 volts, drain 32 at +10 volts, source 30 at +10 volts and substrate 14 at ground for 100 ms per erase. As is apparent from FIG. 7, the threshold voltage shifts by about 0.5 volt between the written and erased conditions.

Figure 8:
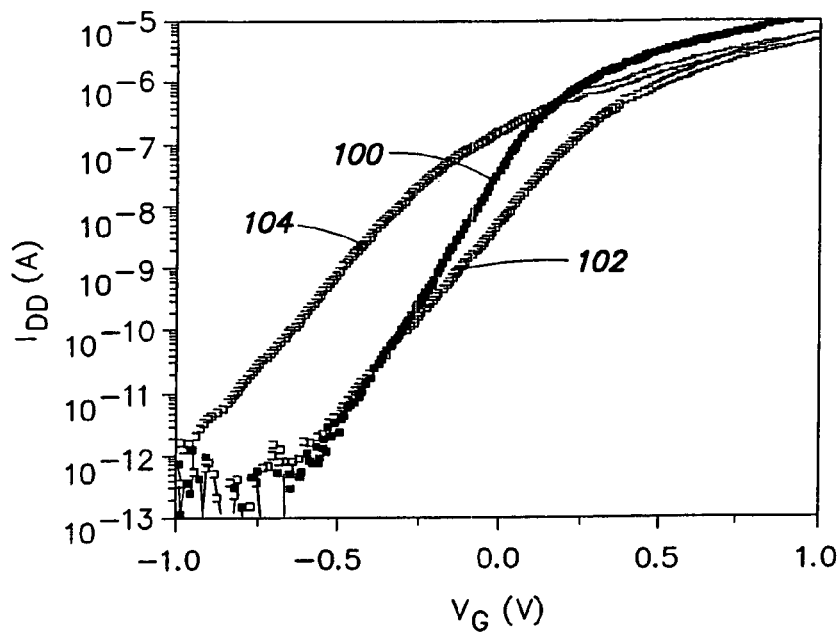
FIG. 8 is a graph that illustrates transfer characteristics of a 0.5 micrometer device in erased and written states in accordance with an embodiment of the invention.
Figure 9:
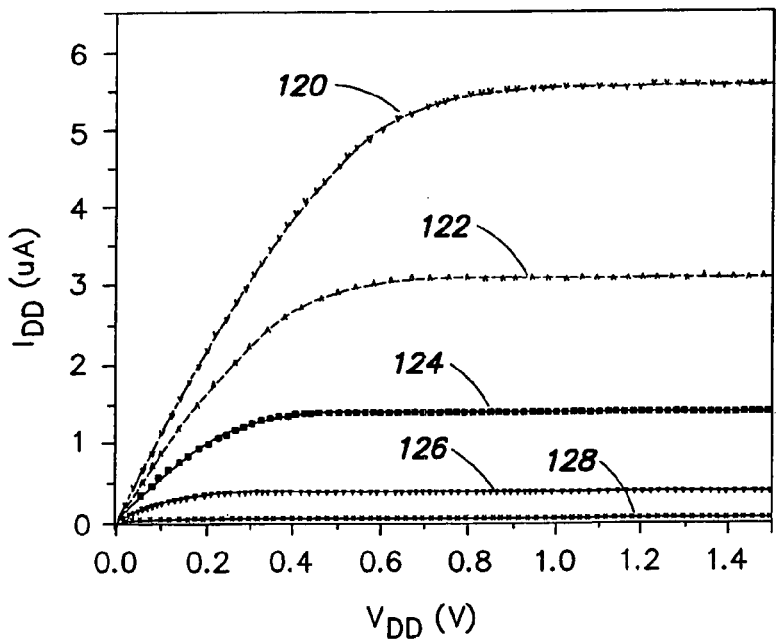
FIG. 9 is a graph that illustrates output characteristics of the 0.5 micrometer device in the erased state.

FIGS. 8 and 9 illustrate the transistor and memory operation of a 0.5 micrometer device of the type shown in FIG. 2 and described above. The charge trapping region 20 included an oxide layer 50 of thickness 7 nanometers, a nitride layer 52 of thickness 20 nanometers and an oxide layer 54 of thickness 100 nanometers. FIG. 8 is a graph of drain current as a function of gate voltage, with drain 32 at 1 volt. Curve 100 represents the transfer characteristic of the device before charging of charge trapping region 20, curve 102 represents the transfer characteristic after writing of charge trapping region 20, and curve 104 represents the transfer characteristic after erasing of charge trapping region 20. The sub-threshold slope degrades from 119 millivolts per decade to 160 millivolts per decade is after charging. FIG. 9 is a graph of drain current as a function of drain voltage in the erased state for different gate voltages. Curves 120, 122, 124, 126 and 128 represent values of gate voltage $V_G$ minus threshold voltage $V_T$ of 0, 0.2, 0.4, 0.6 and 0.8, respectively.

Figure 10:
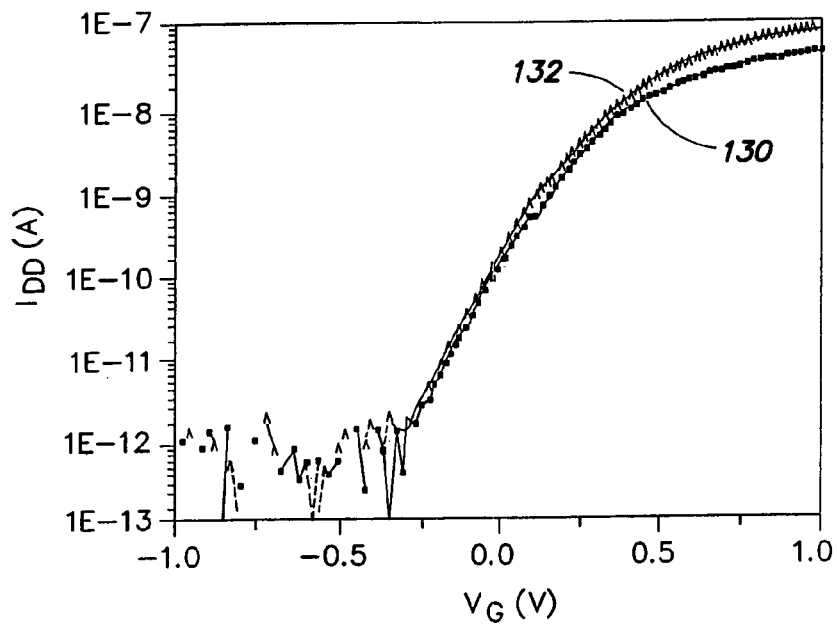
FIG. 10 is a graph that illustrates transfer characteristics of a 50 nm by 50 nm device in accordance with an embodiment of the invention.
Figure 11:
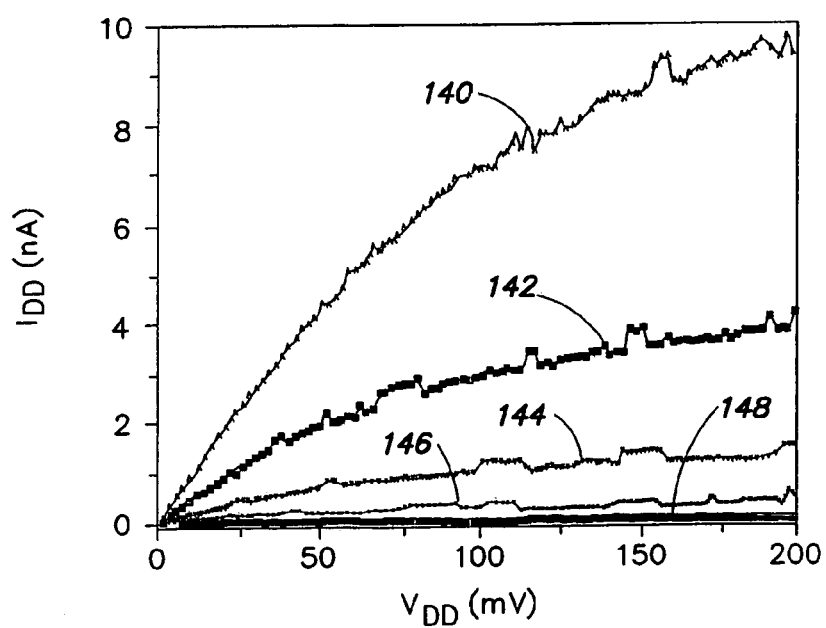
FIG. 11 is a graph that illustrates output characteristics of the 50 nm by 50 nm device.

FIGS. 10 and 11 illustrate transfer and output characteristics, respectively, of a semiconductor device of the type shown in FIG. 2, having gate dimensions of 50 nanometers by 50 nanometers. FIG. 10 is a graph of drain current as a function of gate voltage. Curves 130 and 134 represent drain voltages of 0.1 and 0.2, respectively. The transfer characteristic exhibits a sub-threshold slope of 157 millivolts per decade. FIG. 11 is a graph of drain current as a function of drain voltage in the erased state for different values of gate voltage. Curves 140, 142, 144, 146 and 148 represent values of gate voltage $V_G$ minus threshold voltage $V_T$ of 0, 0.1, 0.2, 0.3, and 0.4, respectively.

Figure 12:
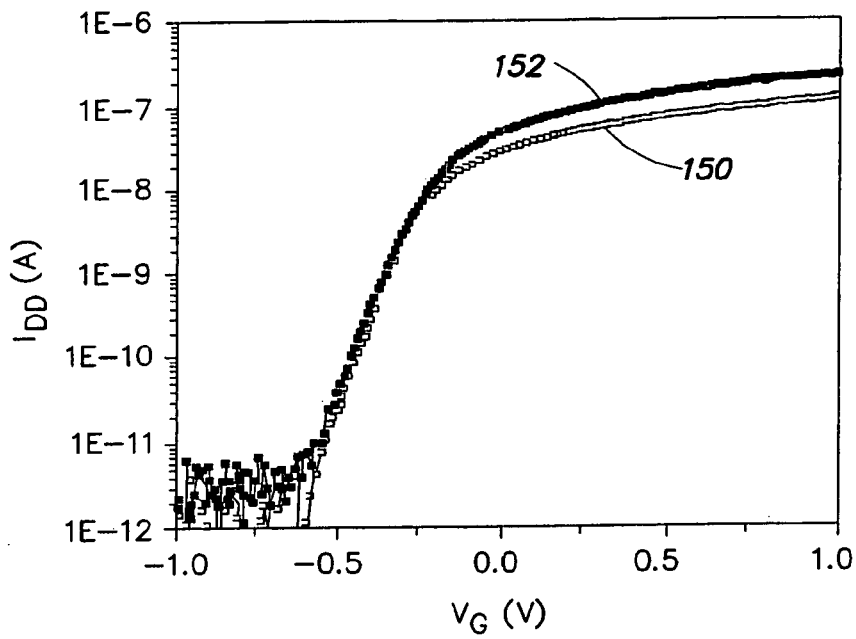
FIG. 12 is a graph that illustrates transfer characteristics of a 100 nm by 100 nm device in accordance with an embodiment of the invention.
Figure 13:
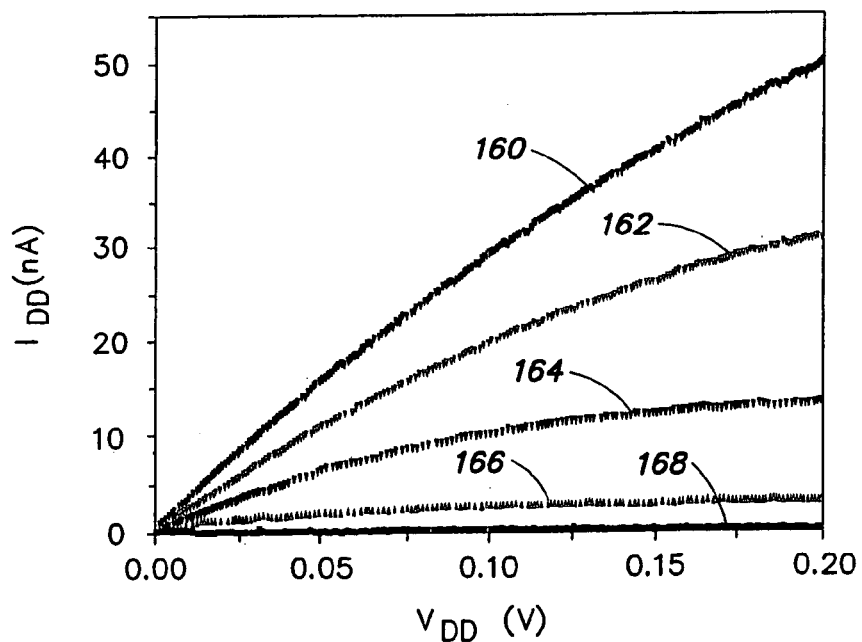
FIG. 13 is a graph that illustrates output characteristics of the 100 is nm by 100 nm device.

FIGS. 12 and 13 show transfer and output characteristics, respectively, of a semiconductor device as shown in FIG. 2 having gate dimensions of 100 nanometers by 100 nanometers. FIG. 12 is a graph of drain current as a function of gate voltage. Curves 150 and 152 represent drain voltages of 0.1 and 0.2, respectively. The transfer characteristic exhibits a sub-threshold slope of 97 millivolts per decade. FIG. 13 is a graph of drain current as a function of drain voltage in the erased state for different values of gate voltage. Curves 160, 162, 164, 166 and 168 represent values of gate voltage $V_G$ minus threshold voltage $V_T$ of 0, 0.1, 0.2, 0.3 and 0.4, respectively.

The experimental characteristics of fabricated devices shown in FIGS. 8 and 9 illustrate the dual use properties of the semiconductor device. With low voltages (less than 2 volts), transistor characteristics with $I_{on}/I_{off}$ gain larger than $10^7$ and sub-threshold slope of 120 millivolts per decade are obtained in these devices consistent with the expected properties for the electrostatic design. FIGS. 10–13 show the output characteristics of the front gate transistor at 50 nanometer and 100 nanometer gate lengths, all at low drain voltages and up to a drive of 0.5 volt above the threshold voltage. When high voltages (between 5 and 10 volts) are used to inject or remove charges from the trapping region, threshold voltage shifts of approximately 0.5 volt are obtained. Reducing the thickness of the charge trapping layers can reduce the writing and erasing voltages, but like the front floating structures, retention and non-volatility issues will be associated with such a design.

Figure 14A:
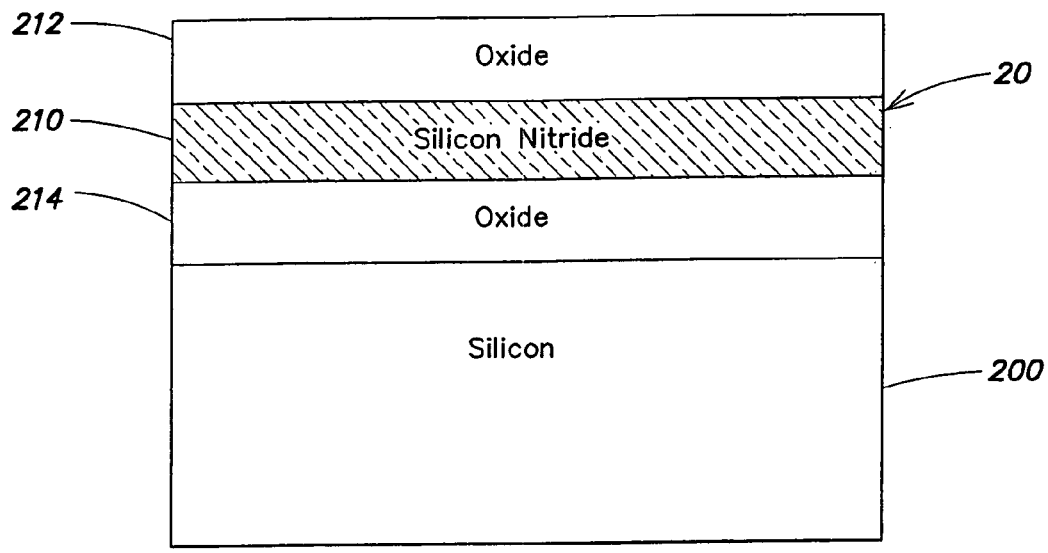
FIGS. 14a–14e illustrate steps in the fabrication of wafers and devices in accordance with an embodiment of the invention.
Figure 14B:
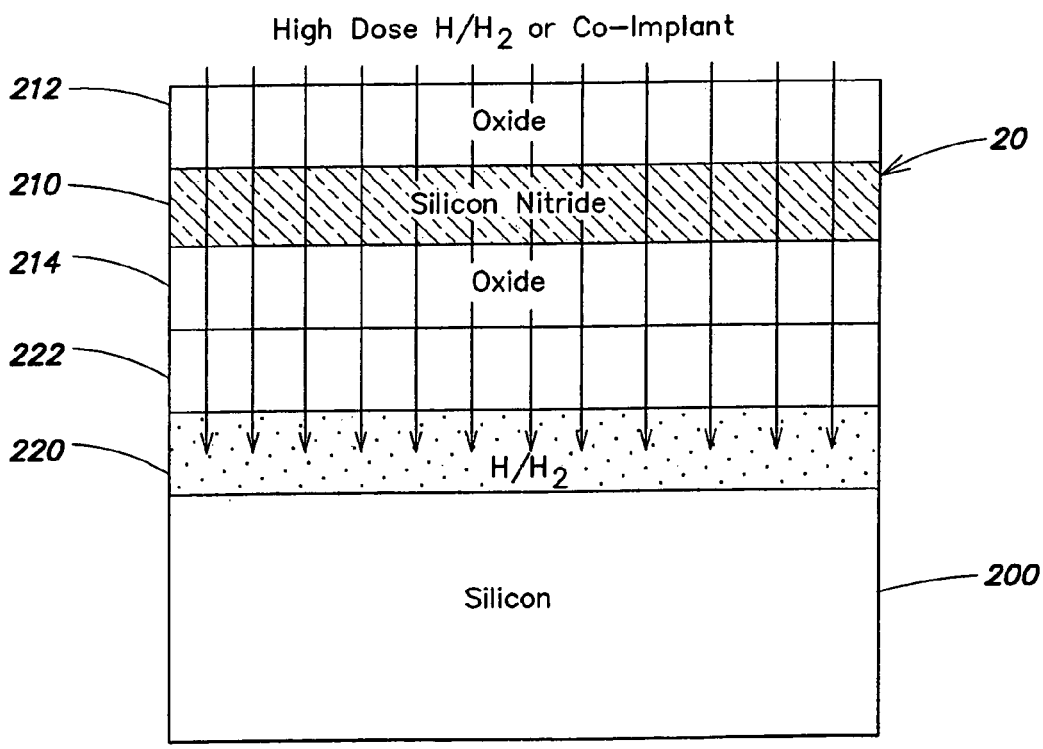

Semiconductor devices and integrated circuits as described herein can be fabricated in a number of different ways. First, a basic semiconductor wafer structure is fabricated. One embodiment of a process for fabricating the wafer structure is shown in FIGS. 14*a*–14*e*. As shown in FIG. 14a, a silicon donor wafer 200 has the charge trapping region 20 formed on its surface. In the example of FIG. 14a, charge trapping region 20 includes silicon nitride layer 210 between oxide layers 212 and 214. As shown in FIG. 14b, a high dose hydrogen implant (from an ionized atomic or molecular beam) or co-implantation step forms a heavily hydrogen-dosed layer 220 in donor wafer 200. Layer 220 is spaced from oxide layer 214, by appropriate selection of implant energy, to provide a desired thickness of a semiconductor layer 222. The hydrogen-dosed layer 220 defines a sacrificial portion of donor wafer 200 to be removed in later processing.

Figure 14C:
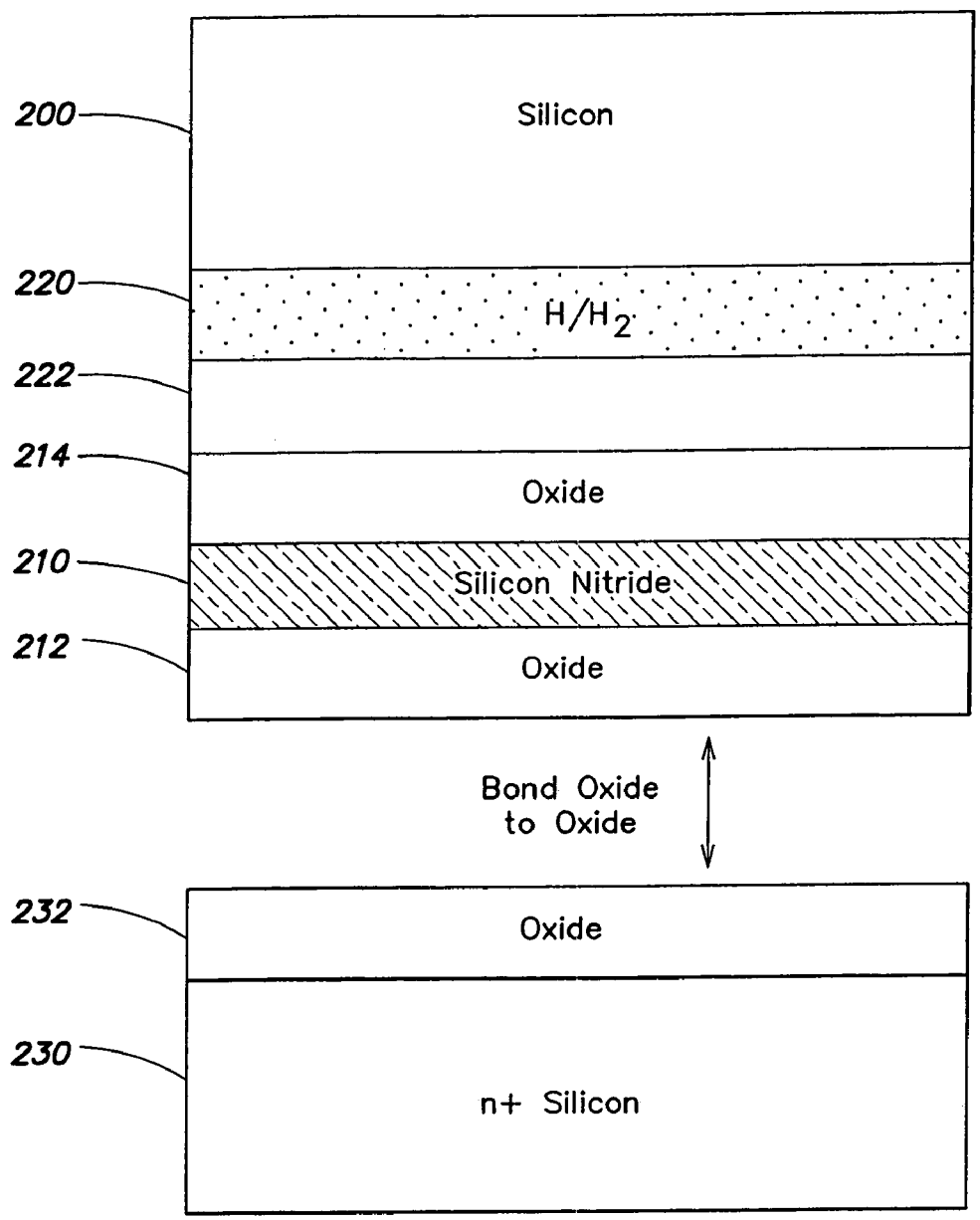
Figure 14D:
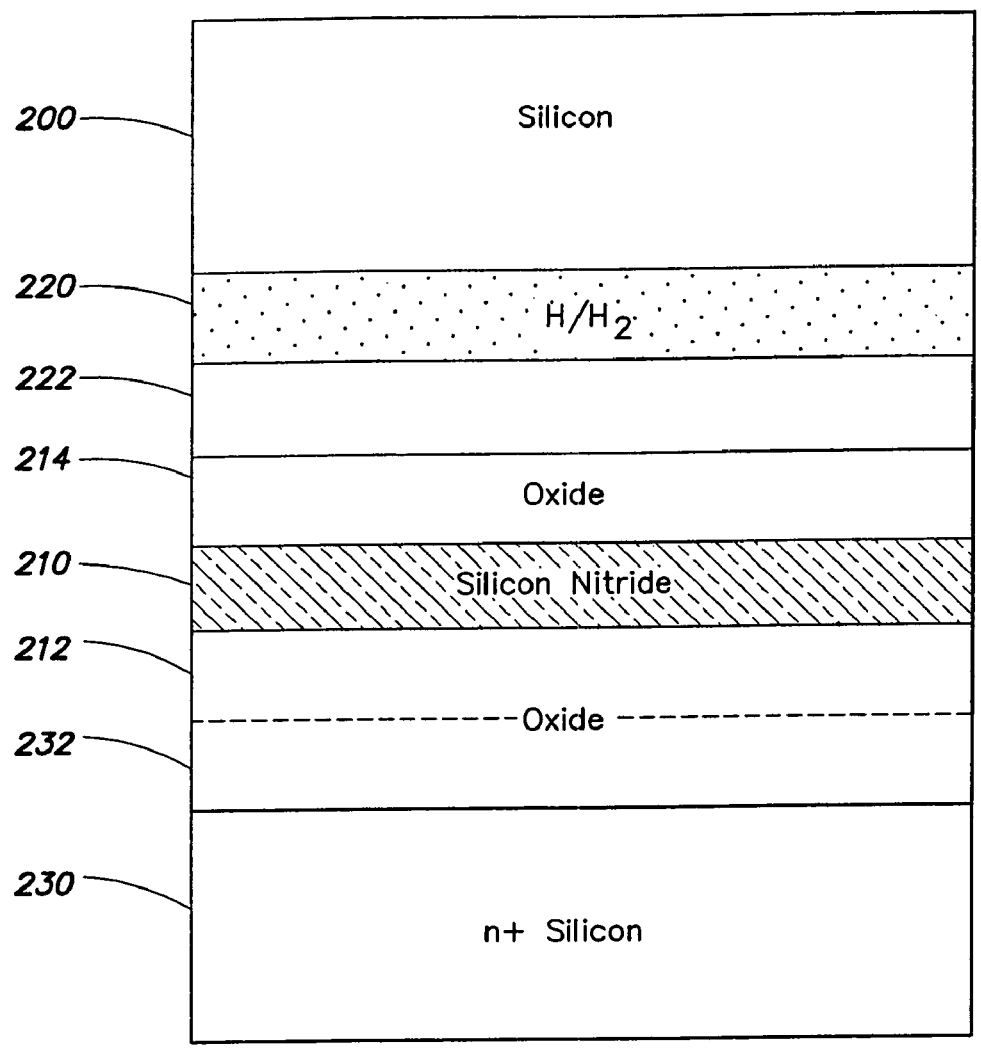

As shown in FIG. 14c, an n+ silicon substrate is oxidized to form an oxide layer 232. The wafer 200 having layers 210, 212, 214, 220 and 222 is flipped over and oxide layer 212 is bonded to oxide layer 232 to form a structure as shown in FIG. 14d. An exfoliation step is then used to cleave off a portion of donor wafer 200 through the splitting caused by excess hydrogen in layer 220 to provide the wafer structure of FIG. 14e.

Figure 14E:
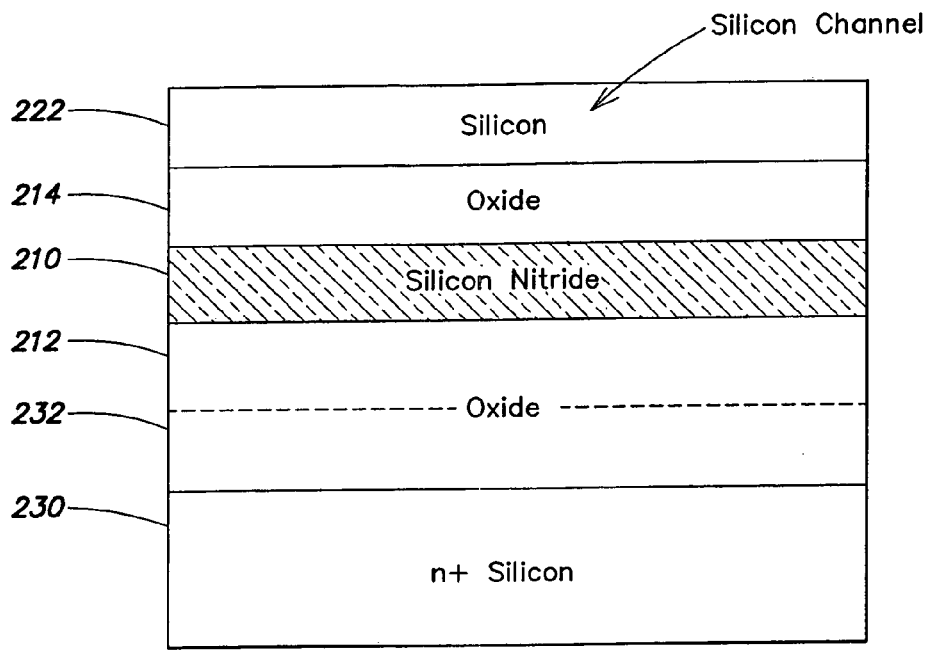

By comparing FIG. 14e and FIG. 2, it is apparent that n+ silicon substrate 230 corresponds to substrate 14, oxide layer 212, 232 corresponds to oxide layer 54, silicon nitride layer 210 corresponds to nitride layer 52, oxide layer 214 corresponds to oxide layer 50, and silicon layer 222 corresponds to silicon layer 24. By way of example only, silicon layer 222 may have a thickness of about 50 nanometers, oxide layer 214 may have a thickness of about 7 nanometers, silicon nitride layer 210 may have a thickness of about 20 nanometers and oxide layer 212, 232 may have a thickness of about 100 nanometers. The wafer is thereby ready for fabrication of circuitry in silicon layer 222 using, for example, conventional CMOS processing.

The donor wafer shown in FIG. 14b may be fabricated as follows. Starting with a p-silicon wafer 200, a thin, dry oxide is grown on the p-wafer to form oxide layer 214. The thickness of layer 214 may be about 7 nanometers. Then, silicon nitride layer 210, typically having a thickness less than 20 nanometers, is deposited on the p-wafer 200. Then, a low temperature oxide is deposited to form oxide layer 212 having a thickness of about 100 nanometers on the p-wafer 200. Finally, a hydrogen implantation with a dose of 6E16 atoms per square centimeter and an energy of 100 keV is performed on the p+ wafer 200 to form layer 220 at a depth of about 600 nanometers. The hydrogen implantation is performed through layers 210, 212, and 214.

Next, an oxide is grown or deposited on n++ wafer 230 (FIG. 14c) to form oxide layer 232. The oxides may be thin enough and smooth enough for bonding as grown or deposited. If not, oxide layers 212 and 232 are polished until each is less than about 50 nanometers in thickness. The surface roughness of layers 212 and 232 after polishing is preferably less than about 2 angstroms. Then, the surfaces of layers 212 and 232 are treated in an oxygen plasma for 10 minutes. The wafers are bonded together as shown in FIGS. 14c and 14d by placing oxide layers 212 and 232 in contact and annealing the wafers for 12 hours at 250° C. Exfoliation of substrate 200 and layer 220 is achieved by heating the wafer at 400° C. for 30 minutes to provide the semiconductor wafer structure shown in FIG. 14e. The silicon layer 222 can be thinned to the desired thickness by chemical mechanical polishing and/or oxidation and etching.

Figure 15A:
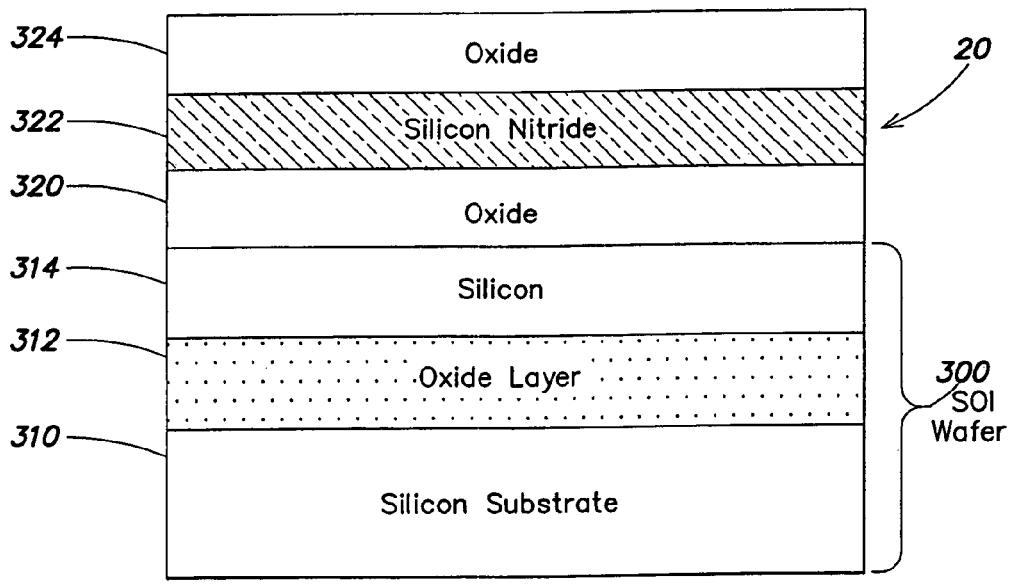
FIGS. 15a–15d illustrate steps in the fabrication of wafers and devices in accordance with another embodiment of the invention.

Another embodiment of a process for fabricating the semiconductor wafer structure is shown in FIGS. 15a–15d. In this embodiment, the charge trapping region 20 is formed on an SOI wafer. As shown in FIG. 15a, an SOI wafer 300 includes a silicon substrate 310, an oxide layer 312 and a silicon layer 314. Charge trapping region 20, including an oxide layer 320, a silicon nitride layer 322 and an oxide layer 324, is formed on SOI wafer 300.

Figure 15B:
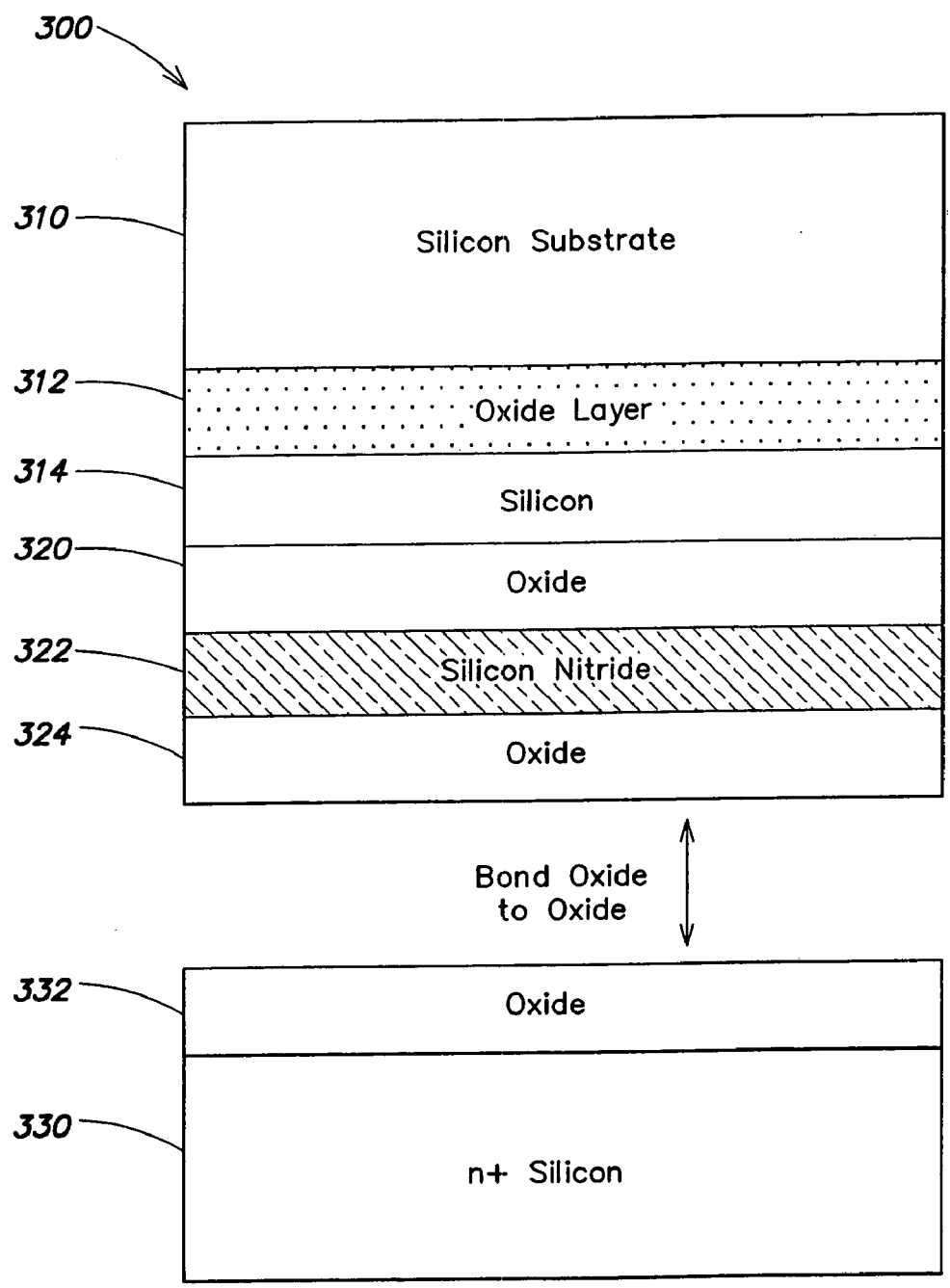
Figure 15C:
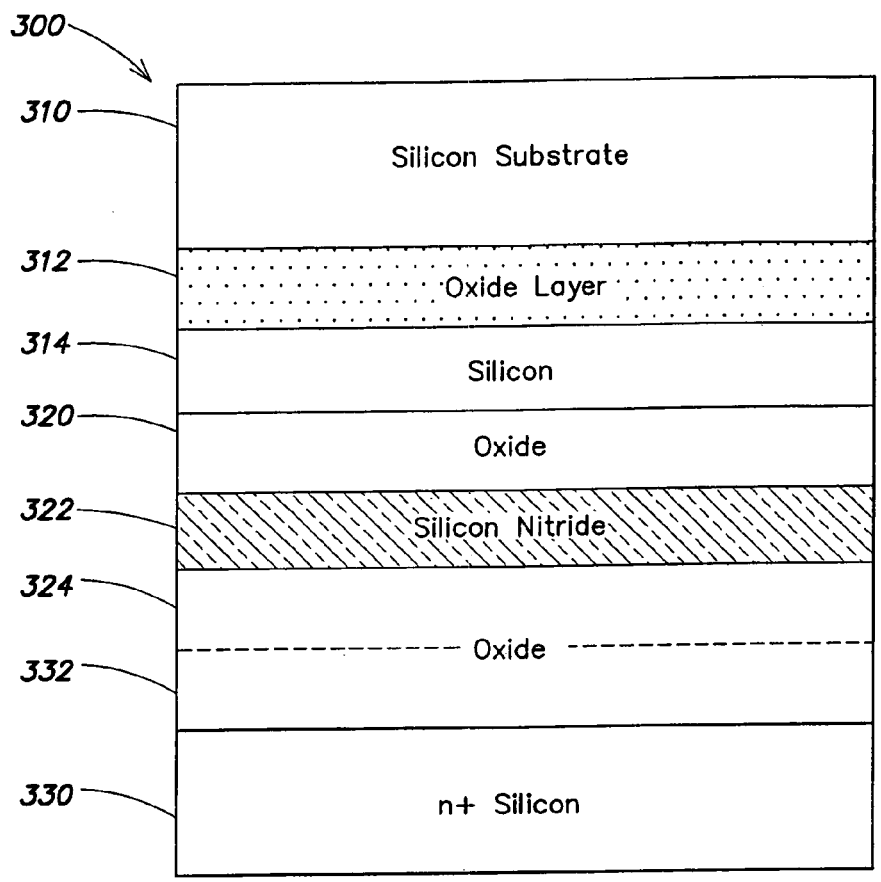

As shown in FIG. 15b, an n+ silicon host wafer 330 having an oxide layer 332 is provided. The SOI wafer 300, having layers 320, 322 and 324 thereon, is flipped over, and oxide layer 324 is bonded to oxide layer 332. The resulting structure is shown in FIG. 15c. Then, the substrate 310 and oxide layer 312 of SOI wafer 300 are removed by grinding, polishing and etching by taking advantage of the oxide/silicon selectivity to provide a wafer structure as shown in FIG. 15d.

Figure 15D:
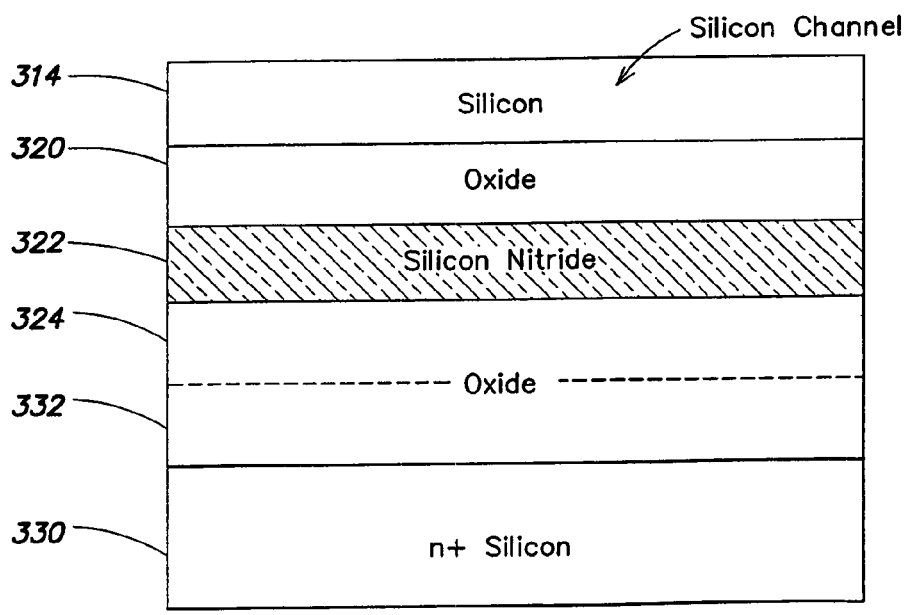

By comparison of FIG. 15d and FIG. 2, n+ silicon substrate 330 corresponds to substrate 14, oxide layer 324, 332 corresponds to oxide layer 54, silicon nitride layer 322 corresponds to nitride layer 52, oxide layer 320 corresponds to oxide layer 50 and silicon layer 314 corresponds to silicon layer 24 in FIG. 2. The wafer is then ready for fabrication of circuitry in silicon layer 314 using, for example, conventional CMOS processing.

In another embodiment, the charge trapping region may be formed by incorporating trapping centers after the semiconductor layer-insulating layer-substrate structure has been formed. For example, the trapping centers may be incorporated by ion implantation or plasma implantation of a species that forms trapping centers. With reference to FIG. 15d, silicon nitride layer 322 may be formed by ion implantation of nitrogen into the oxide near the back surface of silicon layer 314. Other species, such as inert gases and other elements or compounds that form trapping centers, may be implanted to form the charge trapping region. The characteristics of the charge trapping region are determined by appropriate selection of implant species, energy and dose.

For introduction of nanocrystals as trapping regions, these may be formed by a process of chemical or physical deposition and annealing in any of the wafer preparation processes described.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A semiconductor device comprising:
   a substrate;
   a charge trapping region formed on an upper surface of the substrate;
   a semiconductor layer formed on an upper surface of the charge trapping region; and
   at least one transistor formed in the semiconductor layer, wherein the charge trapping region underlies the entire transistor and is separate from and outside the transistor.

2. A semiconductor device as defined in claim 1, wherein the device operates as a transistor in response to a first set of voltages and operates as a memory device in response to a second set of voltages.

3. A semiconductor device as defined in claim 2, wherein the second set of voltages is larger than the first set of voltages.

4. A semiconductor device as defined in claim 1, wherein said charge trapping region comprises a stack of insulating films.

5. A semiconductor device as defined in claim 1, wherein said charge trapping region comprises an injecting layer on a back surface of the semiconductor layer, a charge trapping layer on a back surface of the injecting layer and a control layer on a back surface of the charge trapping layer.

6. A semiconductor device as defined in claim 5, wherein the injecting layer comprises silicon dioxide, the charge trapping layer comprises silicon nitride and the control layer comprises silicon dioxide.

7. A semiconductor device as defined in claim 1, wherein the charge trapping region comprises a silicon dioxide-silicon nitride interface.

8. A semiconductor device as defined in claim 1, wherein the charge trapping region comprises silicon nitride.

9. A semiconductor device as defined in claim 1, wherein the charge trapping region comprises aluminum oxide.

10. A semiconductor device as defined in claim 1, wherein the charge trapping region comprises an oxide that is compatible with silicon processing.

11. A semiconductor device as defined in claim 1, wherein the charge trapping region comprises nanocrystals of a semiconductor material in an oxide, a nitride or another insulating matrix.

12. A semiconductor device as defined in claim 1, wherein the charge trapping region comprises nanocrystals of a metal or metal oxide in an oxide, nitride, or another insulating matrix.

13. A semiconductor device as defined in claim 1, wherein the charge trapping region comprises a material that captures electrons through defects, bulk traps or interface traps.

14. A semiconductor device as defined in claim 1, wherein the charge trapping region comprises a material that captures holes through defects, bulk traps or interface traps.

15. A semiconductor device as defined in claim 1, wherein the charge trapping region comprises a material selected from the group consisting of silicon nitride, aluminum oxide, hafnium oxide, zirconium oxide, hafnium silicate, zirconium silicate, and combinations thereof.

16. A semiconductor device as defined in claim 1, wherein the charge trapping region comprises nanocrystals of a material selected from the group consisting of silicon, germanium and their compounds.

17. A semiconductor device as defined in claim 1, wherein the charge trapping region comprises nanocrystals of an inorganic compound.

18. A semiconductor device as defined in claim 1, wherein the charge trapping region comprises nanocrystals in combination with an insulator that is compatible with silicon processing.

19. A semiconductor device as defined in claim 1, wherein the substrate comprises silicon.

20. A semiconductor device as defined in claim 1, wherein the substrate comprises a group III–IV material.

21. A semiconductor device as defined in claim 1, wherein the substrate comprises a polymer.

22. A semiconductor device as defined in claim 1, wherein charge carriers from a channel of the at least one transistor are energetically injected into the charge trapping region.

23. A semiconductor device as defined in claim 22, wherein the at least one transistor comprises an n-channel transistor and wherein electrons are energetically injected from the n-channel into the charge trapping region.

24. A semiconductor device as defined in claim 22, wherein the at least one transistor comprises a p-channel transistor and wherein holes are energetically injected from the p-channel into the charge trapping region.

25. An integrated circuit comprising:
a substrate;
a semiconductor layer having a plurality of transistors formed therein; and
a charge trapping region on a back surface of the semiconductor layer between the semiconductor layer and the substrate, wherein the charge trapping region is shared by the plurality of transistors.

26. An integrated circuit as defined in claim 25, wherein each of the transistors includes a source, a drain and a gate.

27. An integrated circuit as defined in claim 25, wherein the transistors are configured to perform logic functions.

28. An integrated circuit as defined in claim 49, wherein the transistors are configured as a memory array.

29. An integrated circuit as defined in claim 25, wherein each of the transistors operates as a transistor in response to a first set of voltages and operates as a memory device in response to a second set of voltages.

30. An integrated circuit as defined in claim 29, wherein the second set of voltages is larger than the first set of voltages.

31. An integrated circuit as defined in claim 25, wherein said charge trapping region comprises a stack of insulating films.

32. An integrated circuit as defined in claim 25, wherein said charge trapping region comprises an injecting layer on a back surface of the semiconductor layer, a charge trapping layer on a back surface of the injecting layer and a control layer on a back surface of the charge trapping layer.

33. An integrated circuit as defined in claim 32, wherein the injecting layer comprises silicon dioxide, the charge trapping layer comprises silicon nitride and the control layer comprises silicon dioxide.

34. An integrated circuit as defined in claim 25, wherein the charge trapping region comprises a silicon dioxide-silicon nitride interface.

35. An integrated circuit as defined in claim 25, wherein the charge trapping region comprises silicon nitride.

36. An integrated circuit as defined in claim 25, wherein the charge trapping region comprises aluminum oxide.

37. An integrated circuit as defined in claim 25, wherein the charge trapping region comprises an oxide that is compatible with silicon processing.

38. An integrated circuit as defined in claim 25, wherein the charge trapping region comprises nanocrystals of a semiconductor material in an oxide, a nitride or another insulating matrix.

39. An integrated circuit as defined in claim 25, wherein the charge trapping region comprises nanocrystals of a metal or metal oxide in an oxide, nitride, or another insulating matrix.

40. An integrated circuit as defined in claim 25, wherein the charge trapping region comprises a material that captures electrons through defects, bulk traps or interface traps.

41. An integrated circuit as defined in claim 25, wherein the charge trapping region comprises a material that captures holes through defects, bulk traps or interface traps.

42. An integrated circuit as defined in claim 25, wherein the charge trapping region comprises a material selected from the group consisting of silicon nitride, aluminum oxide, hafnium oxide, zirconium oxide, hafnium silicate, zirconium silicate, and combinations thereof.

43. An integrated circuit as defined in claim 25, wherein the charge trapping region comprises nanocrystals of a material selected from the group consisting of silicon, germanium and their compounds.

44. An integrated circuit as defined in claim 25, wherein the charge trapping region comprises nanocrystals of an inorganic compound.

45. An integrated circuit as defined in claim 25, wherein the charge trapping region comprises nanocrystals in combination with an insulator that is compatible with silicon processing.

46. An integrated circuit as defined in claim 25, wherein the substrate comprises silicon.

47. An integrated circuit as defined in claim 25, wherein the substrate comprises a group III–IV material.

48. An integrated circuit as defined in claim 25, wherein the substrate comprises a polymer.

49. A semiconductor wafer comprising:
a substrate;
a charge trapping region on an upper surface of the substrate over substantially the entire substrate; and
a semiconductor layer on an upper surface of the charge trapping region, wherein the charge trapping region separates the substrate and the semiconductor layer over substantially the entire wafer.

50. A semiconductor wafer as defined in claim 49, wherein said charge trapping region comprises a stack of insulating films.

51. A semiconductor wafer as defined in claim 49, wherein said charge trapping region comprises an injecting layer on a back surface of the semiconductor layer, a charge trapping layer on a back surface of the injecting layer and a control layer on a back surface of the charge trapping layer.

52. A semiconductor wafer as defined in claim 49, wherein the charge trapping region comprises a silicon oxide-silicon nitride interface.

53. A semiconductor wafer as defined in claim 49, wherein the charge trapping region comprises silicon nitride.

54. A semiconductor wafer as defined in claim 49, wherein the charge trapping region comprises aluminum oxide.

55. A semiconductor wafer as defined in claim 49, wherein the charge trapping region comprises an oxide that is compatible with silicon processing.

56. A semiconductor wafer as defined in claim 49, wherein the charge trapping region comprises nanocrystals of a semiconductor material in an oxide, a nitride or another insulating matrix.

57. A semiconductor wafer as defined in claim 49, wherein the charge trapping region comprises a material that captures electrons through defects or bulk traps.

58. A semiconductor wafer as defined in claim 49, wherein the charge trapping region comprises a material selected from the group consisting of silicon nitride, aluminum oxide, hafnium oxide, zirconium oxide, hafnium silicate, zirconium silicate, and combinations thereof.

59. A semiconductor wafer as defined in claim 49, wherein the charge trapping region comprises nanocrystals of a material selected from the group consisting of silicon, germanium and their compounds.

60. A semiconductor wafer as defined in claim 49, wherein the charge trapping region comprises nanocrystals of an inorganic compound.

61. A semiconductor wafer as defined in claim 49, wherein the charge trapping region comprises nanocrystals in combination with an insulator that is compatible with silicon processing.

62. A semiconductor wafer as defined in claim 49, wherein the substrate comprises silicon.

63. A semiconductor wafer as defined in claim 49, wherein the substrate comprises a group III–IV material.

64. A semiconductor wafer as defined in claim 49, wherein the substrate comprises a polymer.

* * * * *

UNITED STATES PATENT AND TRADEMARK OFFICE
CERTIFICATE OF CORRECTION

| | | |
|---|---|---|
| PATENT NO. | : 7,057,234 B2 | Page 1 of 1 |
| APPLICATION NO. | : 10/462386 | |
| DATED | : June 6, 2006 | |
| INVENTOR(S) | : Sandip Tiwari | |

It is certified that error appears in the above-identified patent and that said Letters Patent is hereby corrected as shown below:

Column 12,
Line 11, "claim 25" should be -- claim 26 --.
Line 13, "claim 49" should be -- claim 26 --.

Signed and Sealed this

Twenty-second Day of August, 2006

JON W. DUDAS
*Director of the United States Patent and Trademark Office*